(12) United States Patent
Serebryanskiy et al.

(10) Patent No.: US 10,924,130 B1
(45) Date of Patent: Feb. 16, 2021

(54) HIGH RESOLUTION DIGITAL TRIGGER DETECTOR

(71) Applicant: Guzik Technical Enterprises, Mountain View, CA (US)

(72) Inventors: Valeriy Serebryanskiy, Santa Clara, CA (US); Alexander Taratorin, Palo Alto, CA (US); Anatoli B. Stein, Atherton, CA (US)

(73) Assignee: Guzik Technical Enterprises, Mountain View, CA (US)

( * ) Notice: Subject to any disclaimer, the term of this patent is extended or adjusted under 35 U.S.C. 154(b) by 0 days.

(21) Appl. No.: 16/858,866

(22) Filed: Apr. 27, 2020

Related U.S. Application Data

(60) Provisional application No. 62/913,452, filed on Oct. 10, 2019.

(51) Int. Cl.
*H03M 1/12* (2006.01)
*H03H 17/06* (2006.01)

(52) U.S. Cl.
CPC ...... *H03M 1/1245* (2013.01); *H03H 17/0657* (2013.01)

(58) Field of Classification Search
CPC ............. H03M 1/1245; H03H 17/0657; G01R 13/029; G01R 13/0254
USPC .................................. 341/123–155; 711/154
See application file for complete search history.

(56) References Cited

U.S. PATENT DOCUMENTS

| | | |
|---|---|---|
| 5,182,513 A * | 1/1993 | Young ................. G01N 27/904 324/232 |
| 6,753,677 B1 | 6/2004 | Weller et al. |
| 6,892,150 B2 | 5/2005 | Pickerd et al. |
| 7,072,804 B2 | 7/2006 | Weller |
| 7,352,167 B2 | 4/2008 | Sullivan et al. |
| 7,860,674 B2 | 12/2010 | Freidhof et al. |
| 8,866,659 B2 | 10/2014 | Stein et al. |
| 10,523,977 B1 * | 12/2019 | Neill ................ H04N 21/23424 |
| 2007/0222429 A1 * | 9/2007 | Sullivan ............. G01R 13/0254 324/76.15 |
| 2009/0228226 A1 * | 9/2009 | Dobyns .............. G01R 13/0272 702/67 |
| 2014/0047198 A1 * | 2/2014 | Stein .................. G01R 13/0254 711/154 |

(Continued)

FOREIGN PATENT DOCUMENTS

EP 0335496 B1 6/1993

*Primary Examiner* — Lam T Mai
(74) *Attorney, Agent, or Firm* — Burns & Levinson, LLP; Joseph M. Maraia

(57) ABSTRACT

A real time digital trigger detection channel includes an event detector, a pulse former, a low pass filter, an analog-to-digital converter (ADC) and a Discrete Fourier Transform (DFT) processor coupled in series. The event detector is responsive to an applied input signal and the presence of information requiring digital trigger generation. The pulse former generates a pre-determined, limited length, stable pulse signal which is applied to an anti-aliasing, pulse shaping low pass filter. The resultant shaped pulse signal is converted to a sequence of sample values by the ADC, which in turn are applied to the DFT processor, which in turn calculates a discrete Fourier transform of the output sequence of ADC samples, performing trigger position calculation based on values determined by the DFT processor.

12 Claims, 7 Drawing Sheets

(56) References Cited

U.S. PATENT DOCUMENTS

| | | | |
|---|---|---|---|
| 2014/0223471 A1* | 8/2014 | Askren | H04N 21/23424 725/32 |
| 2015/0188560 A1* | 7/2015 | Huang | H03M 1/128 341/122 |
| 2016/0231357 A1* | 8/2016 | Taratorin | G01R 13/029 |
| 2017/0031336 A1* | 2/2017 | Lehane | G01R 13/0254 |
| 2017/0060114 A1* | 3/2017 | Barford | G05B 19/045 |
| 2017/0254835 A1* | 9/2017 | Montijo | G01R 13/0254 |

* cited by examiner

HIGH RESOLUTION DIGITAL TRIGGER DETECTOR

CROSS REFERENCE TO RELATED APPLICATIONS

This application claims priority to and the benefit of U.S. Provisional Patent Application No. 62/913,452, filed on Oct. 10, 2019 and titled "HIGH RESOLUTION DIGITAL TRIGGER DETECTOR", the contents of which are incorporated herein by reference as though fully set forth herein.

FIELD OF THE TECHNOLOGY

The subject technology relates to high speed analog-to-digital converters (ADC) and, more particularly, to high precision time-position detection of trigger events.

BACKGROUND OF THE TECHNOLOGY

High speed digitizers and digital oscilloscopes are used for acquisition and analysis of signals in wide bandwidth radio frequency communications, radar and signal processing, scientific research and other applications. High speed acquisition requires high accuracy triggering capability with trigger signal time resolution being significantly better than the digitizer sampling speed.

High accuracy, real-time triggering is required for real-time signal processing and analysis. However generation of accurate trigger signal presents a challenge for system design. It is well known that sufficient triggering accuracy cannot be achieved using analog circuits due to inaccurate analog "trigger interpolation" (time-to-digital conversion), the procedure used to determine the distance in time between a trigger event and a sampling clock of an analog-to-digital converter (ADC). This factor causes trigger jitter and degrades triggering accuracy.

Digital triggering achieves better accuracy compared to analog triggering. Different approaches for real-time digital triggering are described in the prior art. In a form, conventional digital trigger circuits are implemented using a dedicated high sampling speed trigger channel. This approach is expensive and challenging since it requires signal processing operating at a high sampling rate.

Different methods for digital triggering have been described in the prior art. European Patent No. 0335496B1 describes temporal alignment of waveforms based on calculating cross-correlation between a reference waveform and a signal waveform. However, this approach requires extensive computational resources and cannot be implemented in real time.

U.S. Pat. No. 7,352,167 describes a real-time digital trigger circuit based on a plurality of signal samples and linear sample interpolation to determine trigger level crossings. U.S. Pat. No. 7,072,804 describes digital trigger circuits having additional low pass and high pass filtering circuits improving signal immunity to noise. U.S. Pat. No. 6,753,677 discloses digital trigger generation with a reduced jitter level by improved a two-stage signal interpolation circuit. Sample interpolation achieves sub-sampling resolution, however it results in trigger timing shifts depending on the type of interpolation used. The most important disadvantage of methods described in the above-mentioned patents is that they do not address distortions caused by a composite high speed ADC structure.

High speed digitizers are typically built as composite ADCs employing a plurality of time-interleaved sub-ADCs having mismatches of frequency responses of the sub-ADCs. As a result, real-time equalization is required prior to generating a trigger signal. U.S. Pat. No. 6,892,150 describes digital trigger, generated by FPGA processor based on composite ADC samples, however the digital data from the ADC is not equalized and the resultant trigger signal is distorted. U.S. Pat. No. 7,860,674 describes a digital trigger based on equalized ADC data distributed to a main data channel and trigger processor. However, the trigger channel requires extra real-time data processing (filtering, interpolation) and significant system resources which increases system complexity and makes real-time implementation difficult and expensive. U.S. Pat. No. 8,866,659 describes a real time digital trigger using a dedicated trigger channel with a separate trigger equalizer and filter, achieving sub-sample signal resolution using real-time interpolation. However, even though this trigger channel is equalized, it requires extensive hardware resources, operating at ADC sampling rate, which makes its implementation difficult and expensive.

Due to complexity, cost and limitations of real-time processing using a high sampling rate digital trigger channel, it is therefore desirable to have lower complexity, real-time digital trigger operating at a lower sampling rate and achieving high trigger resolution and accuracy.

SUMMARY

A real-time digital trigger detector processes signals on the output of pulse forming circuit sampled by low sampling rate ADC. A pulse forming circuit generates a pre-determined short duration, arbitrary shaped pulse signal when a trigger event is detected. The pulse signal is low-pass filtered, ensuring that ADC samples do not have aliasing frequency components.

High resolution digital trigger detection is achieved by interpolating band-limited trigger pulse samples using a finite impulse response (FIR) filter and level-crossing detection. However, this approach requires high degree of interpolation, a large number of FIR taps and a significant amount of multiplications which makes real time implementation difficult. Also, level crossing detection ignores pulse shape information, and, therefore, it is less accurate and more susceptible to noise compared to pulse shape-based detection methods.

This disclosure defines method and systems that provide computationally effective trigger detection, and achieving high accuracy and resolution, based on a discrete Fourier Transform (DFT) technique. The phases of harmonics of each trigger pulse are calculated and compared with corresponding phases of a reference trigger pulse. The method achieves very high timing resolution compared to prior art techniques, and allows real-time implementation and optimal trigger calculation for a given system noise spectrum by weighting values of DFT transform.

A digital trigger detector of the subject technology is combined with a high speed ADC, The sampling clocks of the high-speed ADC and trigger ADC have a precise relative phase (for example, as a result of being driven by the same reference clock oscillator and related as rational number). When a high resolution trigger pulse timing position is detected, it is transformed into a sub-sample resolution of the high speed ADC, enabling a precise signal to trigger time-position and accurate timing acquisition of sampled signals.

An exemplary implementation of the method of the disclosure, uses a pulse forming circuit with a 400 MHz low pass cut-off and a 1 GS/s trigger channel ADC. Using a real-time, 16 sample DFT calculation, the method of this disclosure achieves a trigger timing detection with a 0.48 ps RMS value. This trigger detector is used for precise signal acquisition using a 32 GS/s high speed ADC.

DETAILED DESCRIPTION

Figure 1:
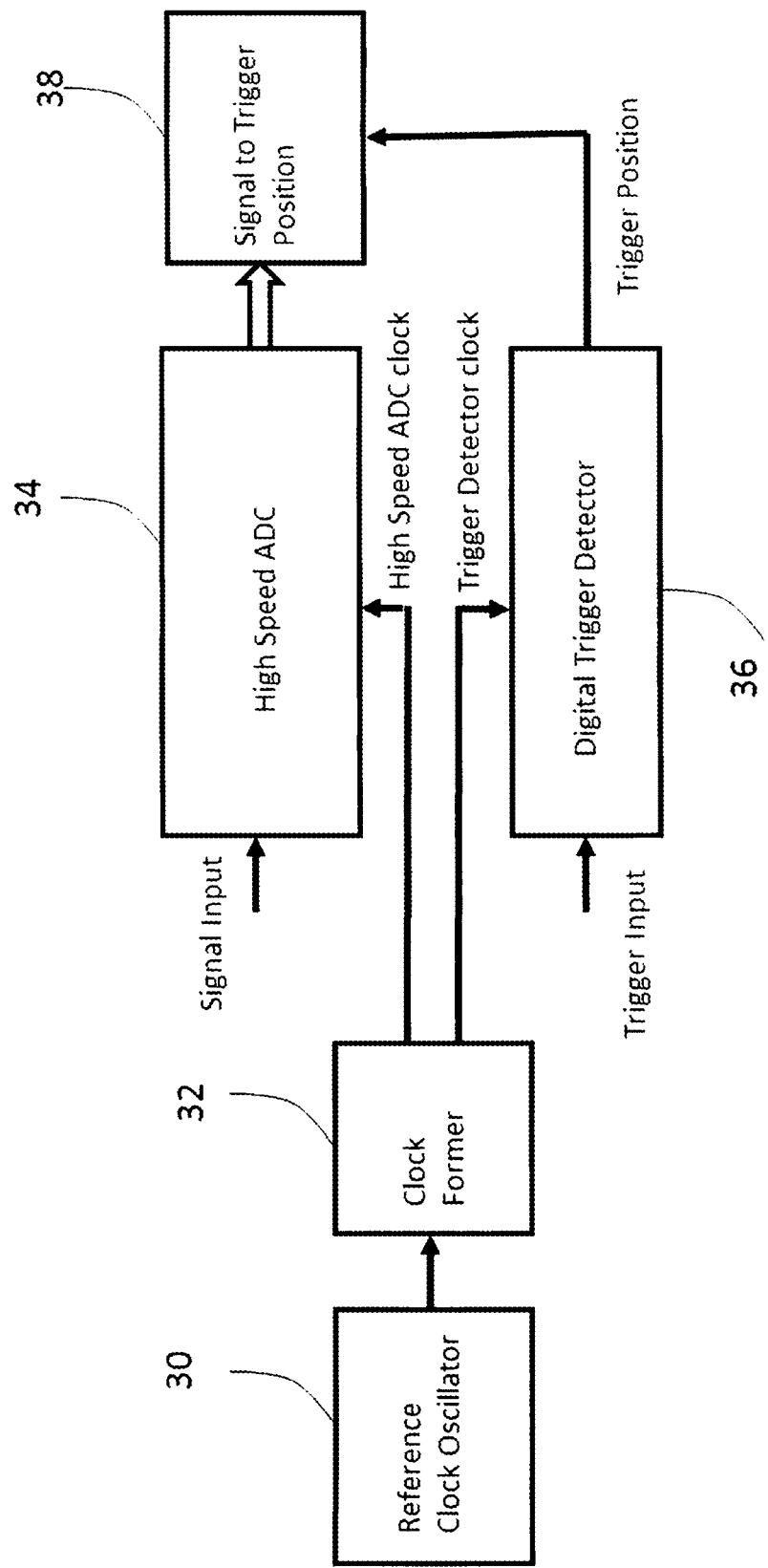
FIG. 1 depicts a block diagram of a high-speed ADC with a digital trigger detector of this disclosure.

An exemplary high speed ADC with real time trigger detector channel of the subject technology is schematically shown in block-diagram of FIG. 1. The system consists of a high speed ADC 34 and digital trigger detector 36. A high speed ADC clock and digital trigger detector clock signals are provided by a clock former circuit 32 driven by a reference clock oscillator 30. The ratio of high speed ADC clock and trigger detector clock frequencies is given by rational number. Using the same reference clock source 30 and a known frequency ratio between digital trigger and high speed clocks, enables calculation of a precise timing shift between a detected digital trigger time-position and high speed signal ADC samples provided by a signal to trigger position block 38. While the block-diagram of FIG. 1 depicts an exemplary implementation of a high-speed ADC with a real time trigger detection channel, other embodiments of the subject technology are possible. For example, a high speed ADC clock and trigger detection clock can be generated by different clock sources, as long as both clocks have a precise relative phase.

Figure 2A:
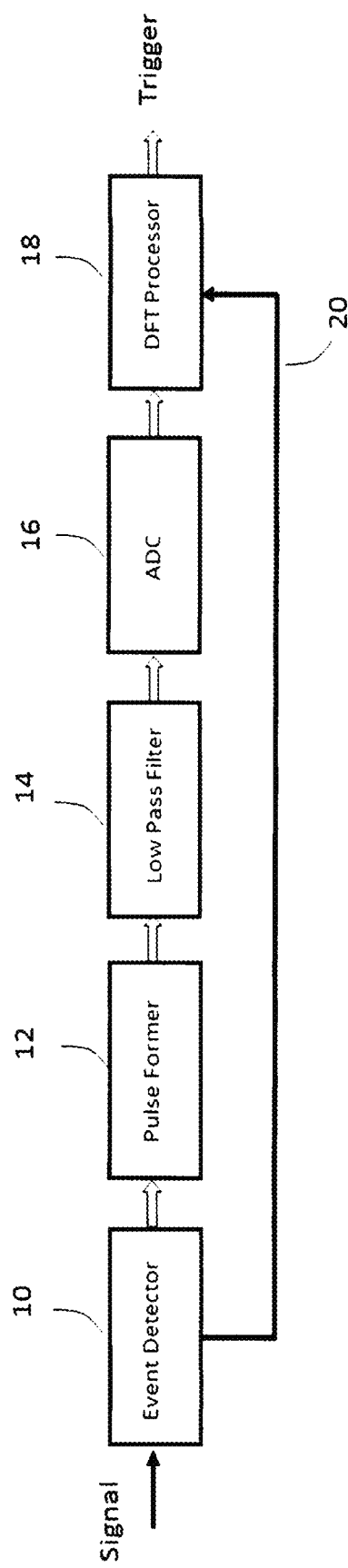
FIGS. 2A and 2B show block diagrams of real-time trigger detector embodiments of this disclosure.

An exemplary real time trigger detector 36 is schematically shown in the block diagram of FIG. 2A. In the illustrated configuration, an input signal is applied to the input of an event detector 10. Depending on the application, the event detector can be based on detection of particular events from input signal (e.g., using a precision level comparator, or power or frequency detector). Whenever the event detector is activated, a pulse former circuit 12 generates a pre-determined analog reference signal of arbitrary shape, for example, a short-duration rectangular pulse. This pulse is filtered by a low pass filter 14 in order to avoid aliasing during sampling by an ADC 16. A DFT processor 18 performs a running DFT calculation for each incoming ADC sample. In order to detect a pulse, DFT processor 18 performs pulse event detection based on calculated DFT phases and amplitudes and reports a trigger timing position if a pulse event was detected. The described embodiment does not require an event trigger connection 20 since pulse detection is performed by DFT processor 18.

Another mode of operation involves event trigger connection 20, which becomes active when event detector 10 is engaged. In this case, the event trigger connection 20 activates DFT processor 18, which in turn, performs a DFT transform calculation and reports a precise trigger timing position on its output.

Figure 2B:
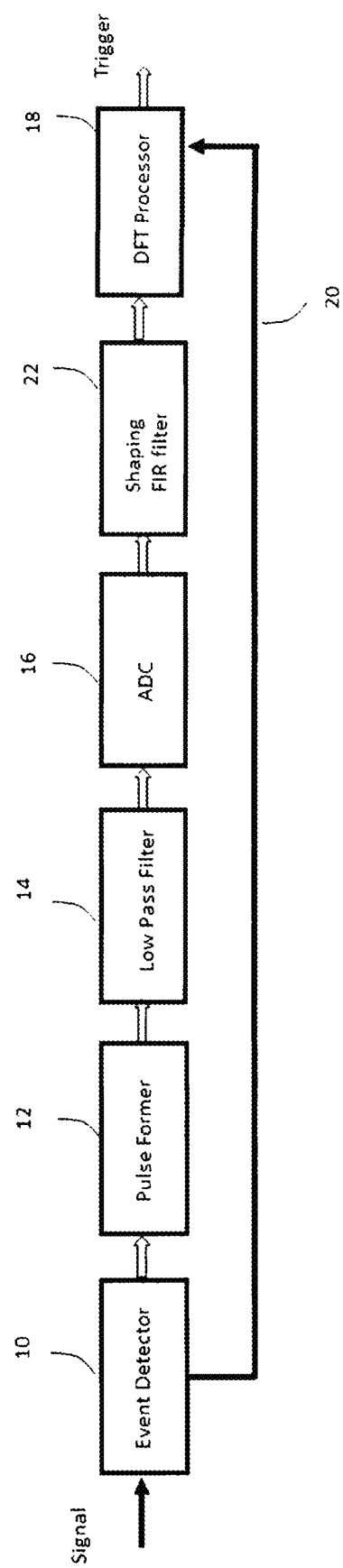

Another exemplary embodiment of the subject technology is shown in the block diagram of FIG. 2B. This embodiment includes an additional element, an FIR shaping filter 22, coupling ADC 16 to DFT processor 18. In a form, coefficients of FIR filter 22 are pre-calculated in order to achieve an optimal shape of a digitized pulse having a specified shape and length of impulse response. This additional digital filtering simplifies operation of DFT processor 18.

Figure 3:
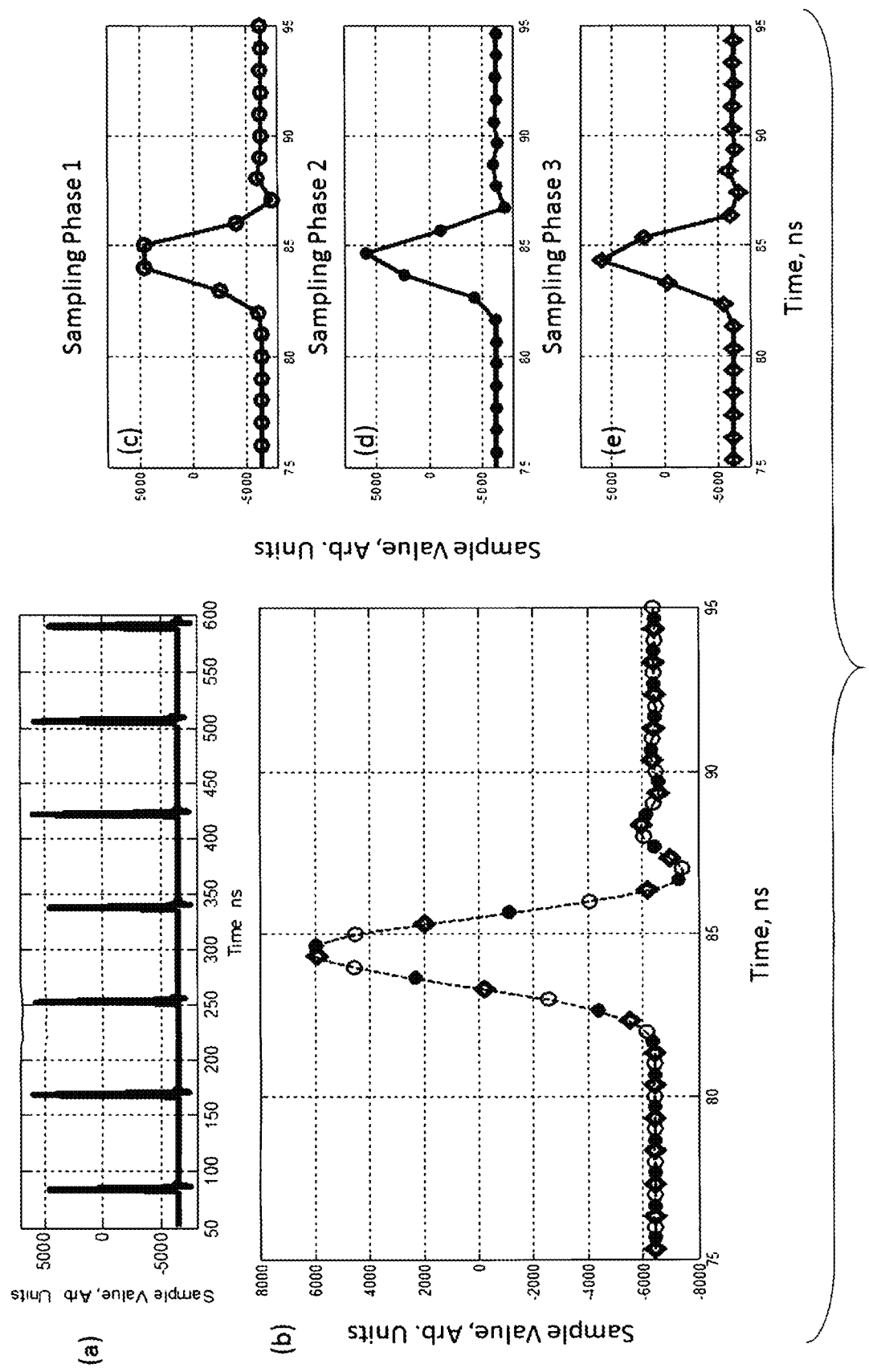
FIG. 3 depicts a stream of pulses with specified sampling phases using a 1 GS/s analog to digital converter (in part (a) of FIG. 3), superposition of samples at different sampling phases (in part(b) of FIG. 3) and individual pulses captured at three distinct sampling phases (in part (c)-(e) of FIG. 3).

To illustrate the operation of the trigger detector of FIGS. 2A and 2B, an experimental setup includes a pulse former 12 which generates a 1 ns wide rectangular pulse and a 400 MHz low pass filter. This pulse is sampled with a 1 GS/s ADC 16, so that the ADC samples are spaced 1 ns apart. The event detector 10 is activated at a 11.8577 MHz pulse repetition rate, so that the pulse former pulses are spaced apart by 84.333(3) ns. When these pulses are sampled, relative sampling phase for each consecutive trigger pulse is shifted exactly by ⅓ of the sampling period. This phase shifting feature is illustrated in FIGS. 3(part (a)-3(part (e). FIG. 3(part (a)) shows a first 600 ns of an incoming pulse sequence. It can be seen that the first pulse occurs at time=84 ns and that pulse has a relatively small amplitude, while the relative amplitudes of the second and third pulse of the sequence are higher. However, the fourth pulse, occurring at time=337 ns, is again smaller in amplitude and is similar to the first pulse. FIG. 3(part (b)) shows a high resolution (expanded scale) interpolated pulse shape (dashed line) for the first pulse of the stream, occurring at time=84 ns). In the pulse shown in FIG. 3(part (b)), ADC samples corresponding to the first sampling phase (pulses 1, 4, 7 . . . ) are shown by open circles. Samples for pulses 2, 5, 8, . . . are shown by dark filled circles, while samples for pulses 3, 6, 9 are shown by diamonds. FIGS. 3(part (c)), 3(part (d)) and 3(part (e)) depict pulses corresponding to each of the sampling phases.

Figure 4:
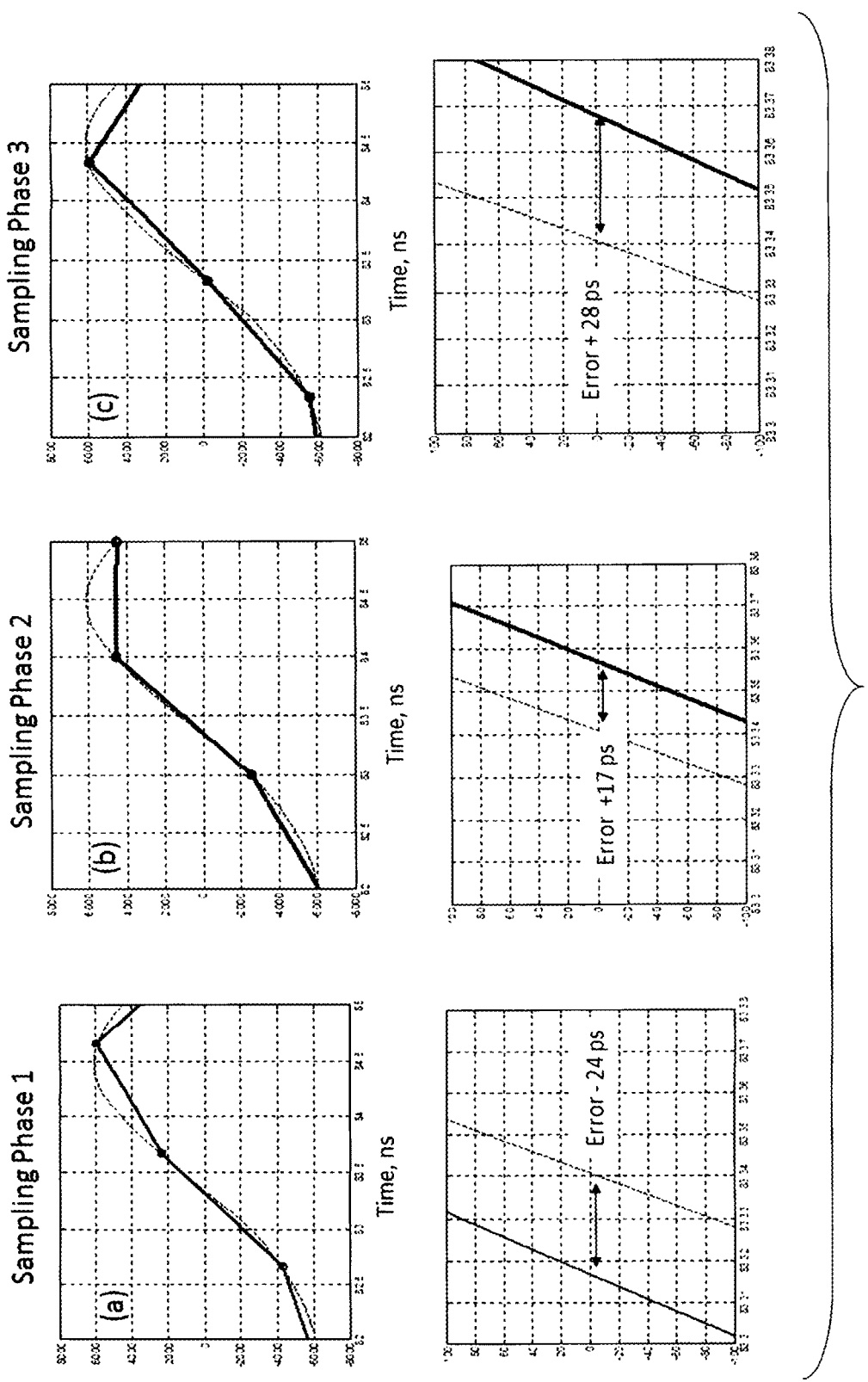
FIG. 4 illustrates timing detection errors for pulses of FIG. 2 using linear interpolation for level-crossing detection.

A "standard" (or "prior art") method for pulse level crossing detection is based on interpolation between samples. Linear interpolation is commonly used for digital triggering due to simplicity of real-time implementation. However, that prior art method generates unacceptable timing errors, which depend on relative sample phase. For example, FIG. 4 illustrates timing errors caused by prior art linear interpolation for sampling phases 1, 2 and 3. As seen, for sampling phase 1, linear interpolation results in negative 24 ps error; for sampling phase 2 in positive 17 ps error; and for sampling phase 3 in positive 28 ps. Clearly, this prior art level of trigger positioning error is not acceptable.

Timing detection error can be significantly reduced by using interpolating FIR filter or Fourier transform interpolation methods. Using an interpolation factor of 10 followed by linear interpolation between samples, achieves approximately 1 ps trigger accuracy. However accurate an FIR interpolator requires significant system resources: namely, a large number of FIR taps (e.g. 160 taps for interpolating 16 samples pulse by 10), followed by an additional linear interpolation stage. Moreover, it should be mentioned that timing detection based on level crossing is not optimal. That method ignores details of pulse shape and is more sensitive to noise compared with optimal pulse shape detection, e.g. based on cross-correlation. However, even for a small number of samples, cross-correlation operation requires intensive calculations and is not feasible for real-time trigger operation. Also, resulting cross-correlation function needs to be interpolated to obtain high trigger resolution.

This disclosure provides a simple practical solution for trigger detection based on a Discrete Fourier Transform (DFT) method. The discrete Fourier transform converts a sequence of N signal samples $x_0$, $x_1, \ldots, x_{N-1}$ into sequence of complex numbers $X_0, X_1, \ldots, X_{N-1}$ which is defined by the following equation:

$$X_k = \sum_{n=0}^{N-1} x_n e^{-i\frac{2\pi}{N}kn}$$

Each complex number $X_k$ corresponds to k-th harmonic and is represented by a harmonic amplitude $A_k$ and phase $\varphi_k$ as $X_k = A_k e^{i\varphi_k}$. A fundamental property of Fourier transform is that a signal timing shift $x(t-\tau)$ translates to a linear phase shift in the frequency domain: $\Im(x(t-\tau)) = X(\omega)e^{-i\omega\tau}$. Therefore, the DFT harmonics of a delayed signal are given by $$X_k = A_k e^{i\left(\varphi_k - \frac{2\pi}{N}k\tau\right)}.$$

Since the phases of reference pulse harmonics $\varphi_k$ are known, the phase differences between a reference pulse and an incoming pulse is equal to $\Delta\varphi_k =$ $$\frac{2\pi}{N}k\tau$$

and can be converted to a timing shift by normalizing to a corresponding frequency $$\frac{2\pi}{N}k.$$

While a phase shift of all harmonics is proportional to $$\frac{2\pi}{N}k\tau,$$

in practice, each pulse harmonic has a certain signal to noise ratio $SNR_k$, which is determined by its harmonic amplitude and noise at corresponding frequency. Based on the signal to noise ratio, weighting coefficients $W_k$ (such as $$\sum_{k=0}^{N-1} W_k = 1),$$

are defined for each DFT harmonic. For example, weighting coefficients can be defined as $$W_k = SNR_k \bigg/ \sum_{k=0}^{N-1} SNR_k.$$

This procedure ensures that noisy harmonics have a smaller contribution to the delay value and provide an optimal calculation for a given frequency dependent SNR. In this case, timing delay is calculated using a weight coefficients as $$\tau = \sum_{k=0}^{N-1} W_k \frac{\Delta\varphi_k N}{2\pi k}$$

Figure 5:
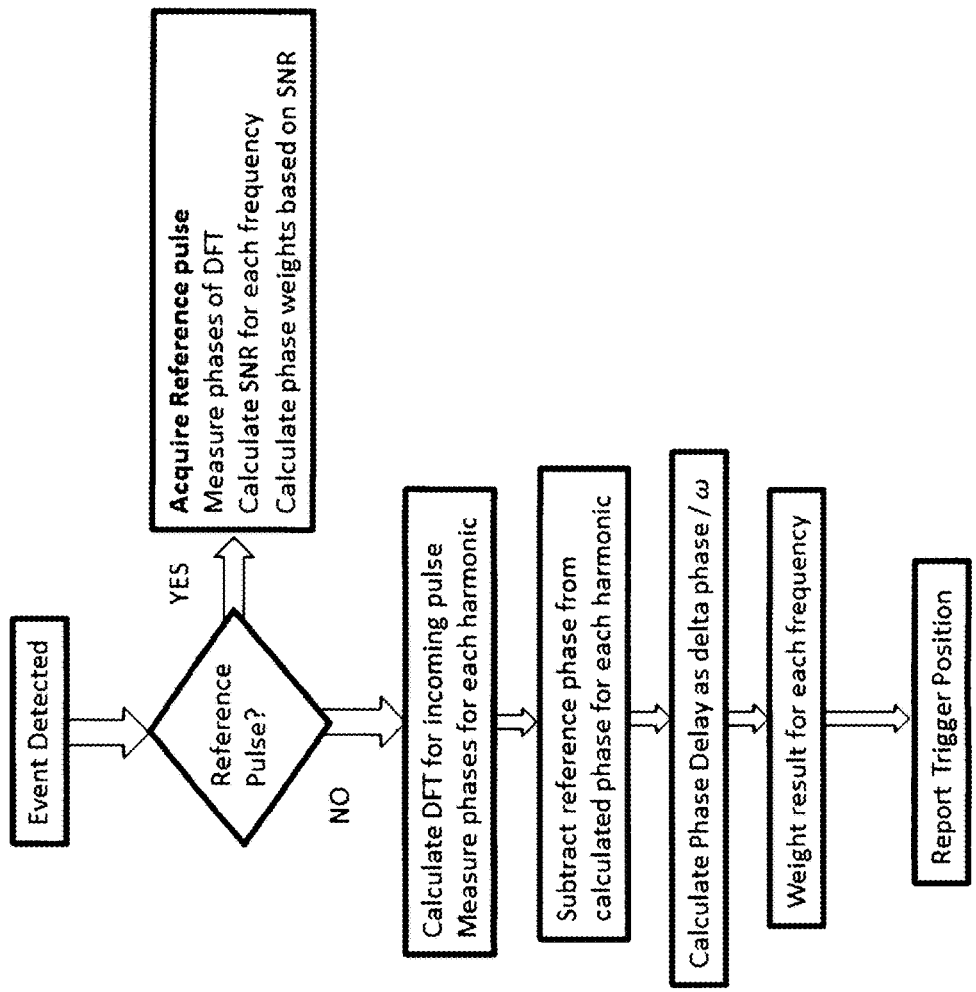
FIG. 5 shows a flow chart of an exemplary DFT trigger detection method of the current disclosure.

The method of the disclosure is summarized on a flow chart in FIG. 5. First, a reference pulse (e.g., a first pulse in a series of pulses) is analyzed, and phases of DFT harmonics are calculated and stored as reference phases. Also, depending on system SNR frequency dependence, phase weights are calculated for subsequent pulses. For each incoming ADC sample, a DFT is calculated, reference phases are subtracted, phase delay at each frequency is evaluated as difference phase normalized by frequency, results are weighted and a trigger position is reported.

The DFT approach of the disclosure has a number of important advantages. Phases of the DFT harmonics carry information about signal shape, so a trigger detector is not limited to a particular level-crossing and is more robust to noise. A short DFT for power of 2 lengths (e.g., 16 samples) is very effectively calculated using a symmetry of DFT coefficients and allows real-time implementation. No complicated interpolation filters are required since phase differences are directly translated to time delay. Finally, a signal to noise ratio (SNR) for each harmonic is taken into account by weighting a contribution of each phase to the total calculation.

Figure 6:
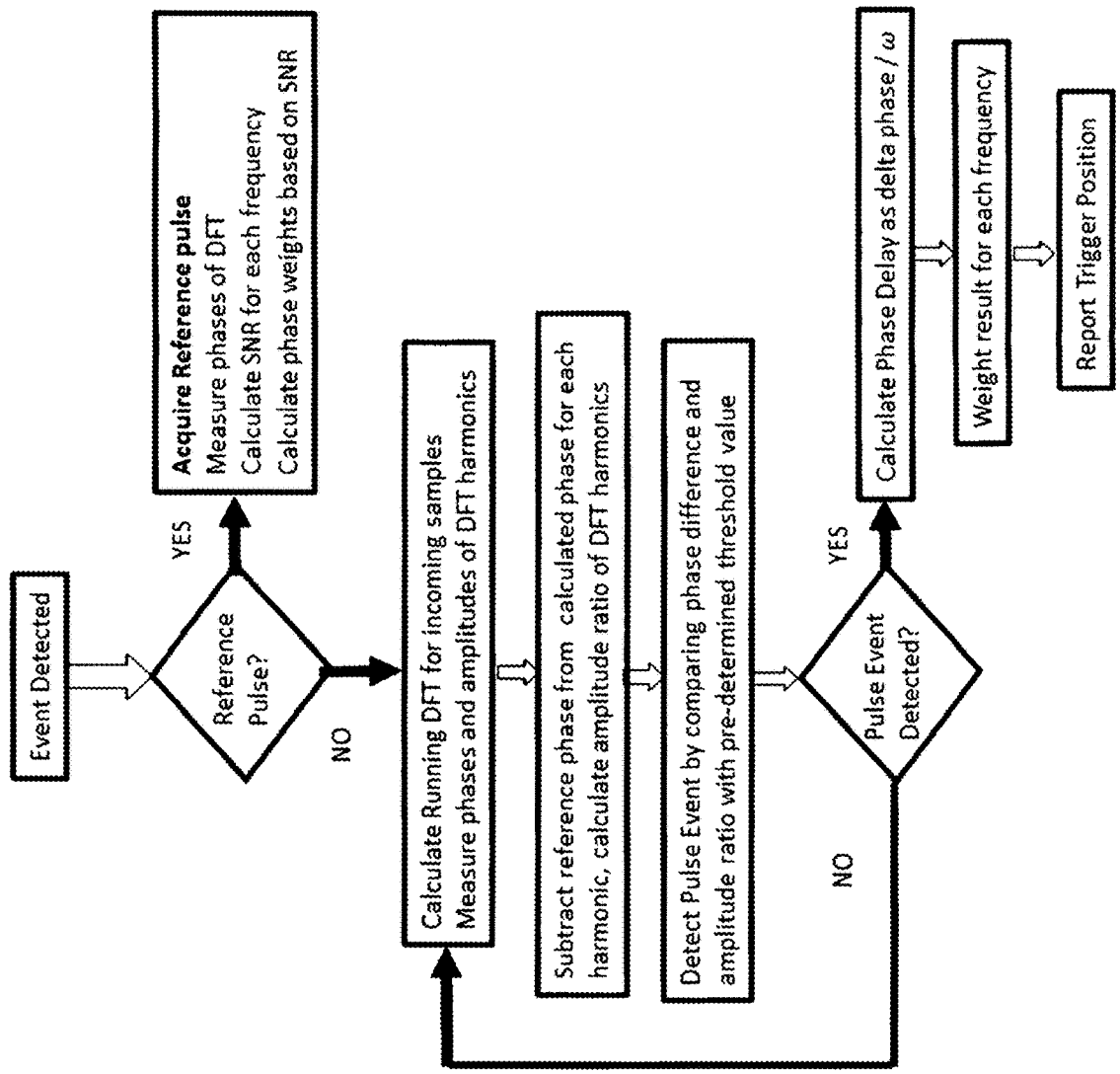
FIG. 6 shows a flow chart of an exemplary trigger detection method with a running DFT pulse event detector.

The small number of operations required for DFT calculation allows a calculation of a "running" DFT, wherein length N DFT coefficients are calculated for each incoming sample, preceded by N−1 samples. In this mode of operation, pulse event detection is performed in real time by comparing a ratio of DFT harmonic amplitudes and phase differences with pre-determined thresholds. A flow chart of a running DFT detector is schematically shown in FIG. 6. If a pulse event is detected based on amplitude ratio and phase difference, a phase delay is calculated and a trigger position is reported. Otherwise, a running DFT calculation is resumed until a pulse event detection occurs.

The DFT detection technique of the disclosure uses stable and repeatable pulse shape on the output of pulse forming circuit 12 and anti-aliasing low pass filter matched with sampling speed of ADC 16. Best detection is achieved when an impulse response of a low pass filter 14 is shorter than a selected DFT window. It is preferred that successive trigger pulses not overlap within a DFT window. For example, using a 1 GS/s ADC and 16 DFT samples, trigger pulses are best separated by at least 16 ns intervals.

Figure 7:
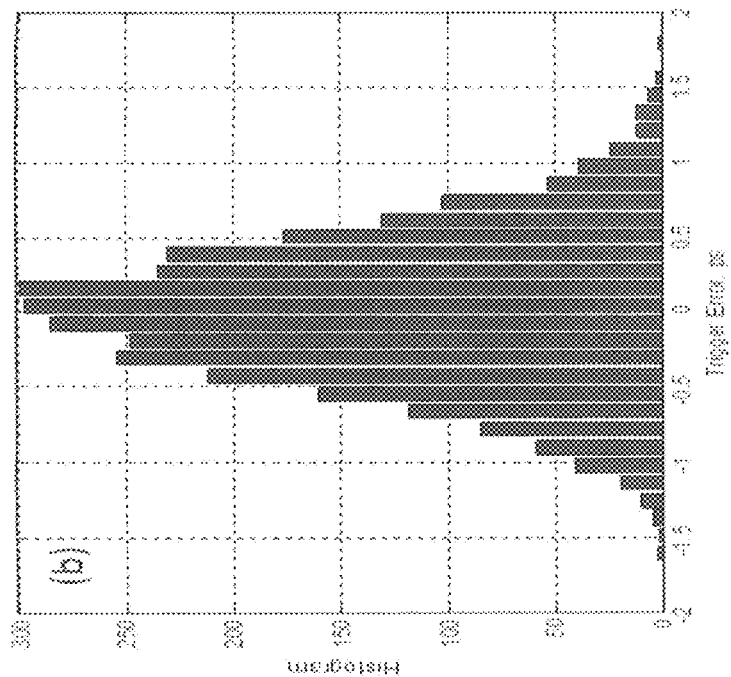
FIG. 7 shows results of an exemplary trigger position measurement for 3100 consecutive pulses (in part (a)) and a histogram of trigger detection timing errors (in part (b)).
Figure 7:
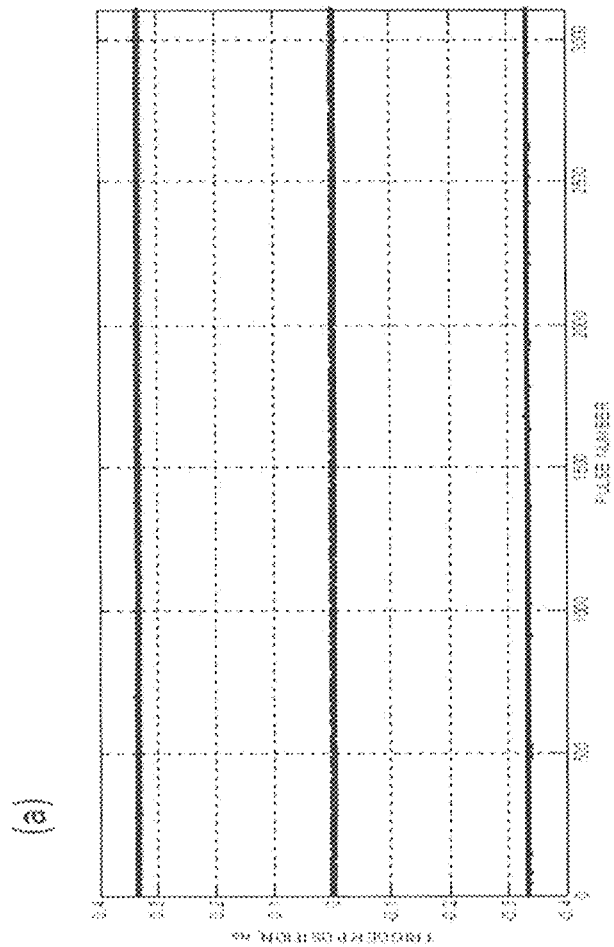

FIGS. 7(part (a)) and -7(part (b)) shows the result of DFT-based phase processing of 3100 individual pulses using a hardware setup with the 1 GS/s ADC and 400 MHz low pass filter of FIG. 2A. The sequence of trigger time instants is depicted in FIG. 7(part (a)), where 3 distinct levels, corresponding to 0, +0.333 and −0.333 ps are seen. FIG. 7(part (b)) shows a histogram of timing errors over 3100 trigger pulses. The histogram is symmetrically centered at a zero location, which indicates that there are no sampling phase mode shifts. A standard deviation of trigger time errors is 0.48 ps. For comparison, a level-crossing trigger detection method using quasi-ideal 50× Fourier interpolation, followed by linear level crossing detection, achieves a standard deviation of 0.85 ps and about 0.3 ps mode shifts depending on sampling phase.

The detected trigger pulse timing determined in accordance with the disclosure, is used for accurate timing acquisition of a high-speed ADC according to block diagram of FIG. 1. The clocks of a low sampling rate trigger ADC 16, and of a high speed ADC, are driven by the same reference oscillator, for example, running at 1 GS/s and 32 GS/s. This allows a conversion of trigger pulse timing to sub-sample resolution of a high speed ADC and ensures accurate acquisition of signal samples relative to trigger position.

Therefore, the method and system of the disclosure achieve a better trigger detection result compared to the prior art, by utilizing information about pulse shape and a frequency dependent system signal to noise ratio. This method does not require extensive calculations and is feasible for real-time implementation. In accord with the disclosure, detection with high timing accuracy is based on a low sampling rate ADC without need for complicated real-time equalization.

Although the subject technology has been described in terms of certain embodiments, other embodiments that are apparent to those of ordinary skill in the art, including embodiments which do not provide all the benefits and features set forth herein, are also within the scope of the subject technology. Accordingly, the scope of the subject technology is defined only by reference to the appended claims.

What is claimed is:

1. A digital trigger detector, comprising:
   a trigger processor operative in real time, and including:
   A. an event detector operative to (i) receive an input signal representative of one or more temporally spaced apart events-of-interest, (ii) detect from the received input signal the one or more events-of-interest, and (iii) in response the detection, generate a corresponding one or more requests for a digital trigger associated with the respective detected one or more events-of-interest,
   B. a pulse former responsive to the request, to generate at a pulse former output, a trigger pulse for each detected event-of-interest, wherein the respective trigger pulses are characterized by a predetermined pulse length, pulse shape, and stability over time,
   C. a lowpass filter adapted to process the trigger pulses to provide anti-aliasing to, and shaping of, the respective trigger pulses, wherein the lowpass filter is characterized by an anti-aliasing cutoff frequency,
   D. a trigger detector (TD) analog to digital converter having (i) a TD-ADC signal input adapted to receive the processed trigger pulses, and (ii) an TD-ADC output, wherein in response to an applied TD-ADC sampling clock, the TD analog to digital converter generates a TD sequence of digitized samples of the processed trigger pulses, wherein the sampling is at an TD-ADC sampling rate substantially matched to the anti-aliasing cutoff frequency of the low pass filter, whereby the TD sequence of digitized samples for each processed trigger pulse is a digital representation of a detected digital trigger, and
   E. a DFT processor adapted to receive the TD sequence and calculate therefrom, a discrete Fourier transform (DFT) of the TD sequence, yielding a plurality of DFT harmonics associated with the respective digitized samples of the TD sequence, and, based on the DFT harmonics, determine a time-position for a digital trigger associated with the respective detected one or more events-of-interest.

2. A digital trigger detector according to claim 1, wherein the DFT processor is operates in a continuous mode, to:
   A. designate a first trigger pulse applied to the DFT processor, as a reference pulse, and determine and store a reference phase and amplitude associated with the reference pulse,
   B. determine a running DFT for each of the digitized samples applied to the DFT processor after the first trigger pulse, thereby generating the plurality of DFT harmonics associated with the respective digitized samples,
   C. for the DFT of each of the digitized samples applied after the first trigger pulse, determine phase difference and amplitude ratios of DFT harmonics relative to the reference phase and amplitude,
   D. based on comparing the determined phase difference and amplitude ratios to predetermined threshold values, detect the presence of a trigger pulse,
   E. for each detected trigger pulse, determine a phase delay for each DFT harmonic as a ratio of phase difference with respect to the reference pulse phase to frequency,
   F. for each detected trigger pulse, determine a time-position for an associated digital trigger based on the delays determined from the DFT harmonics.

3. A digital trigger detector according to claim 2, further comprising
   a DFT processor operative in real time to:
   i. measure a signal-to-noise ratio (SNR) for each DFT harmonic, and determine weights for each DFT harmonic based on the measured SNR values, and
   ii. for each detected trigger pulse, determine a time-position for an associated digital trigger based on the determined weights.

4. A digital trigger detector according to claim 1,
   wherein the DFT processor is adapted to activate in response to a request from the event detector, to perform the following operations:
   a. designate a first pulse of the trigger pulse signal applied to the DFT processor, as a reference pulse, and determine and store a reference phase associated with the reference pulse,
   b. determine phase of each pulse of the trigger pulse signal, and subtract the reference pulse phase from the respective determined phase to obtain a phase difference for the respective pulse,
   c. determine a phase delay for each of the DFT harmonics associated with the respective trigger pulses as a ratio of the determined phase difference to frequency, and
   d. for each detected trigger pulse, determine a trigger pulse delay based on the delays determined from the DFT harmonics.

5. A digital trigger detector according to claim 4,
   a DFT processor operative in real time to:
   i. measure a signal-to-noise ratio (SNR) for each DFT harmonic, and determine weights for each DFT harmonic based on the measured SNR values, and
   ii. for each detected trigger pulse, determine a time-position for an associated digital trigger based on the determined weights.

6. A digital trigger detector according to claim 1, further comprising a digital FIR filter adapted to shape the TD sequence of digitized samples prior to receipt by the DFT processor.

7. A digitizer comprising:
  A. a clock former adapted to receive an applied periodic reference clock signal and in response thereto, provide
    i. a trigger detector (TD) sampling clock at a TD clock former output, characterized by a first clock frequency,
    ii. a high speed ADC (HS-ADC) sampling clock at a HS-ADC clock former output, characterized by a second clock frequency,
    wherein a ratio of the frequency of the HS-ADC sampling clock signal and the frequency of the TD sampling clock signal is a rational number, and
  B. a high speed analog to digital converter (HS-ADC) having
    i. an HS-ADC signal input adapted to receive an analog signal-to-be-processed,
    ii. an HS-ADC sampling clock input adapted to receive the HS-ADC sampling clock from the HS-ADC clock former output, and
    iii. an HS-ADC output,
    wherein the HS-ADC is operative to sample an analog signal-to-be-processed received at the HS-ADC input with an HS-ADC sampling clock received at the HS-ADC sampling clock input, and provide on the HS-ADC output, a sequence of HS-ADC samples at the HS-ADC output,
  C. a digital trigger detector, operative in real time, including:
    i. inputs adapted to receive:
      1. the TD sampling clock, and
      2. a trigger signal representative of one or more events-of-interest, and
    ii. an event detector adapted to detect from the trigger input signal, the one or more events-of-interest, and generate a corresponding one or more requests for a digital trigger associated with the respective detected one or more events-of-interest,
    iii. operative in response to the detection of the one or more events-of-interest,
      a. a pulse former responsive to the one or more requests adapted to generate a trigger pulse for each detected event, wherein the respective trigger pulses are characterized by a predetermined pulse length, pulse shape, and stability over time, and
      b. a lowpass filter operative to process the trigger pulses to provide anti-aliasing and shaping of the respective trigger pulses,
      c. a trigger detector (TD) analog to digital converter operative to (i) receive the processed trigger pulses at a TD-ADC input and (ii) apply the TD sampling clock to a TD-ADC sampling clock input, whereby a TD sequence of digitized samples is applied to a TD-ADC output, wherein the TD sequence of digitized samples for each processed trigger pulse is a digital representation of a detected digital trigger, and
      d. a discrete Fourier transform (DFT) processor operative to perform a discrete Fourier transform on the TD sequence yielding a plurality of DFT harmonics associated with the respective digitized samples of the TD sequence, and based on the DFT harmonics, determine a time-position for a digital trigger associated with the respective detected one or more events-of-interest.

8. A digitizer according to claim 7 wherein the relative phase of HS-ADC sampling clock and the TD sampling clock is maintained by a common reference clock oscillator.

9. A digitizer according to claim 7, further comprising a Signal-to-Trigger Position (STP), processor having:
  i. a first STP input adapted to receive from the HS-ADC output, and
  ii. a second STP input adapted to receive a time-position of the detected digital triggers, and
    wherein the STP processor is adapted to perform a position determination for a signal from the HS-ADC relative to a detected trigger.

10. A digitizer according to claim 7, wherein the first clock frequency is greater than the second clock frequency.

11. A digitizer according to claim 7, wherein the first clock frequency is less than the second clock frequency.

12. A digitizer according to claim 7, wherein the first clock frequency is equal to the second clock frequency.

* * * * *